(12) United States Patent
Lutz

(10) Patent No.: US 9,236,315 B2
(45) Date of Patent: Jan. 12, 2016

(54) ELECTRICAL TEST STRUCTURE FOR DEVICES EMPLOYING HIGH-K DIELECTRICS OR METAL GATES

(71) Applicant: GLOBALFOUNDRIES Inc., Grand Cayman (KY)

(72) Inventor: Robert C. Lutz, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/222,999

(22) Filed: Mar. 24, 2014

(65) Prior Publication Data
US 2014/0203280 A1 Jul. 24, 2014

Related U.S. Application Data

(63) Continuation of application No. 13/311,785, filed on Dec. 6, 2011, now Pat. No. 8,723,177.

(51) Int. Cl.
*H01L 21/66* (2006.01)

(52) U.S. Cl.
CPC ............... *H01L 22/30* (2013.01); *H01L 22/34* (2013.01)

(58) Field of Classification Search
CPC ......... H01L 22/00; H01L 22/10; H01L 22/12; H01L 22/14; H01L 22/30
See application file for complete search history.

(56) References Cited

U.S. PATENT DOCUMENTS

| | | | |
|---|---|---|---|
| 5,396,097 A | 3/1995 | Robb et al. | |
| 5,742,542 A * | 4/1998 | Lin et al. | 365/185.08 |
| 5,764,569 A | 6/1998 | Wright | |
| 6,087,189 A | 7/2000 | Huang | |
| 6,127,193 A | 10/2000 | Bang et al. | |
| 6,210,999 B1 | 4/2001 | Gardner et al. | |
| 6,258,437 B1 | 7/2001 | Jarvis | |
| 6,429,452 B1 | 8/2002 | Jarvis | |
| 6,777,957 B1 | 8/2004 | Yang et al. | |
| 6,897,476 B1 | 5/2005 | Kim et al. | |
| 6,977,195 B1 | 12/2005 | Bush et al. | |
| 7,851,793 B2 | 12/2010 | Wang et al. | |
| 7,851,864 B2 | 12/2010 | Chung et al. | |
| 2005/0110082 A1 | 5/2005 | Cheng et al. | |
| 2010/0314619 A1 | 12/2010 | Kaltalioglu et al. | |
| 2011/0186934 A1 | 8/2011 | Chen et al. | |

* cited by examiner

*Primary Examiner* — Matthew Reames
(74) *Attorney, Agent, or Firm* — Amerson Law Firm, PLLC

(57) ABSTRACT

A test structure includes an active region formed in a semiconducting substrate, a first line formed above and extending over an upper surface of the active region, and a first isolation region formed in the semiconducting substrate, wherein the active region surrounds the first isolation region. The test structure further includes a first extension formed above the active region and on and in contact with an upper surface of the first isolation region, wherein the first extension extends laterally over the upper surface of the active region from a first side of the first line. Additionally, the first line and the first extension are comprised of at least one of a high-k layer of insulating material and a metal layer.

18 Claims, 9 Drawing Sheets

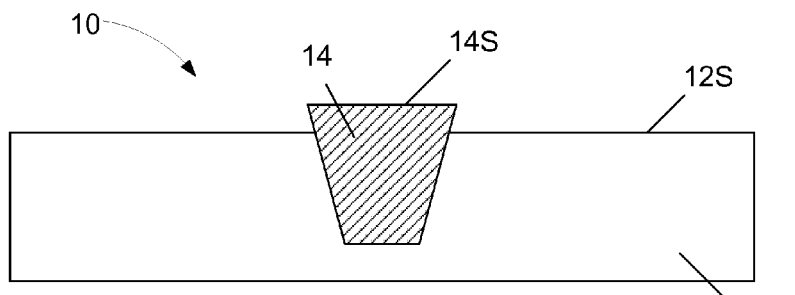
(Prior Art) Figure 1A
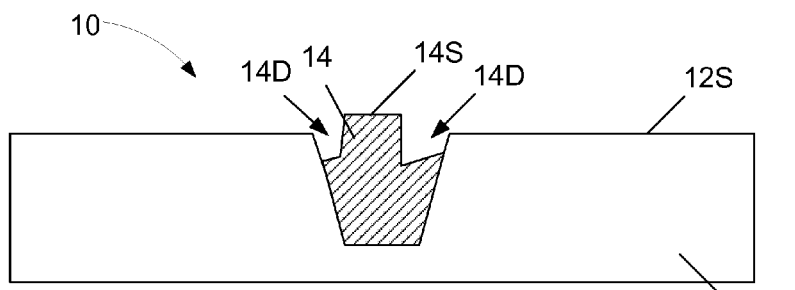
(Prior Art) Figure 1B
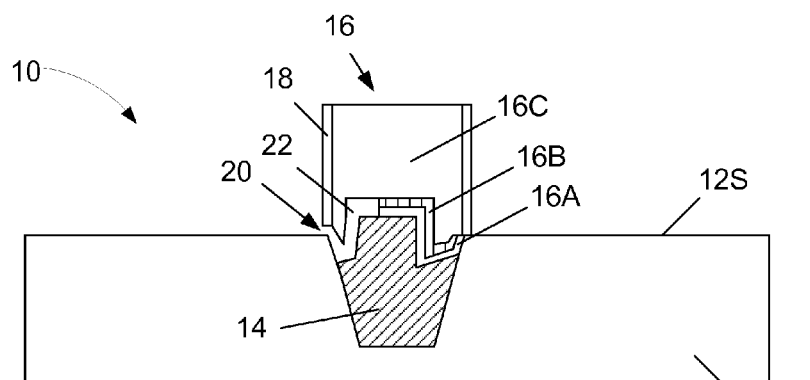
(Prior Art) Figure 1C

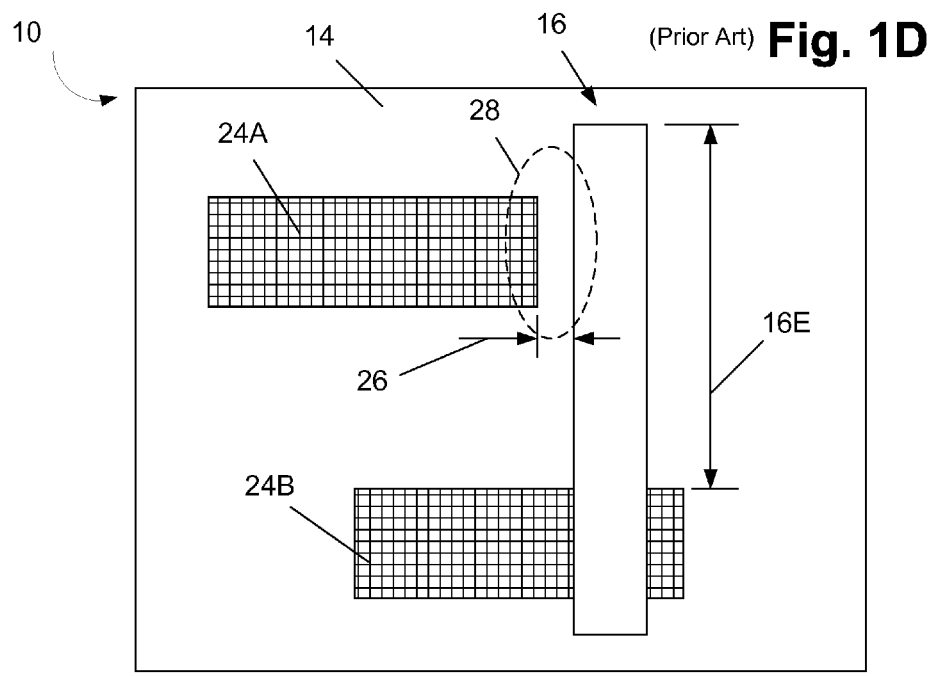
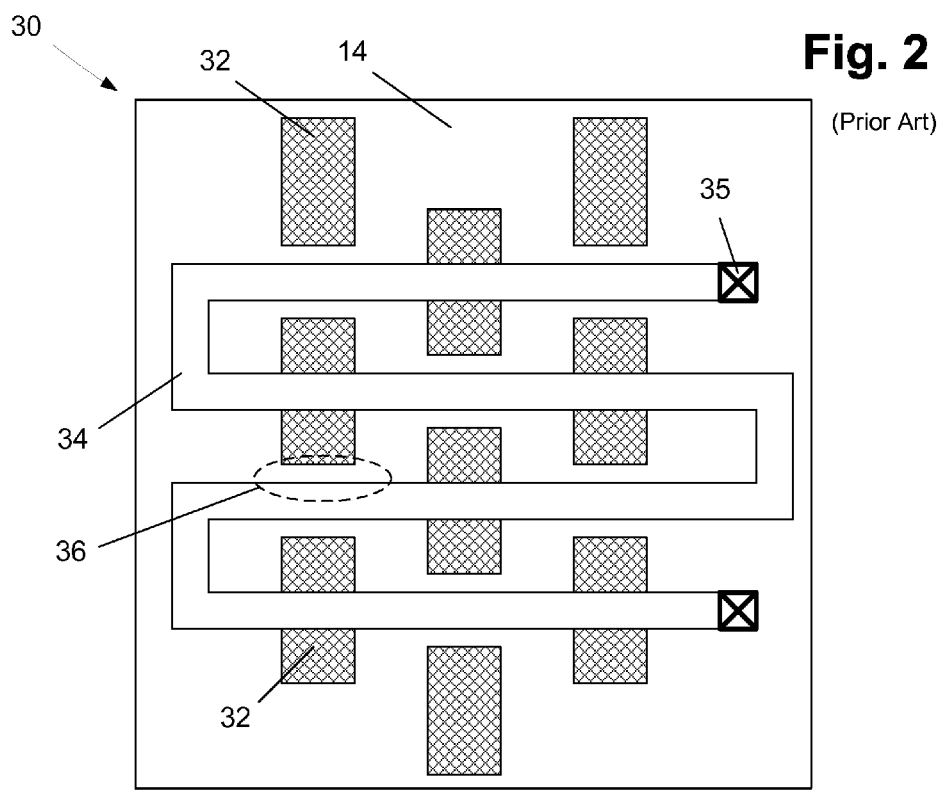

ELECTRICAL TEST STRUCTURE FOR DEVICES EMPLOYING HIGH-K DIELECTRICS OR METAL GATES

CROSS-REFERENCE TO RELATED APPLICATION

This is a divisional of co-pending application Ser. No. 13/311,785, filed Dec. 6, 2011.

BACKGROUND OF THE INVENTION

1. Field of the Invention

Generally, the present disclosure generally relates to the manufacturing of sophisticated semiconductor devices, and, more specifically, to various electrical test structures for evaluating semiconductor devices that employ high-k dielectrics and/or metal gate electrode structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

For many early device technology generations, the gate electrode structures of most transistor elements have been made from a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations. These high-k dielectric materials (k value greater than 10) may include, for example, hafnium oxide, zirconium oxide, etc. Illustrative metal gate electrode materials include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like. The HK/MG structures may be formed using so-called "gate-first" or "gate-last" techniques.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layer are patterned. Then, an etching process is performed to form trenches in the substrate for the STI structure using the patterned pad oxide layer and pad nitride layer as an etch mask. Thereafter, a deposition process is performed to overfill the trenches with an insulating material, such as silicon dioxide. A chemical mechanical polishing (CMP) process is then performed using the pad nitride layer as a polish-stop layer to remove the excess insulation material. Then, a subsequent deglazing (etching) process may be performed to insure that the insulating material is removed from the surface of the pad nitride layer. This deglaze process removes some of the STI structures.

Numerous processing operations are performed in a very detailed sequence, or process flow, to form integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. As a result, the STI structures may have an uneven upper surface and may not perform their isolation function as intended, which may result in problems such as increased leakage currents, etc. Furthermore, since the erosions of the STI structures is not uniform across a die or a wafer, such structures may have differing heights, which can lead to problems in subsequent processing operations. For example, such height differences may lead to uneven surfaces on subsequently deposited layers of material which may require additional polishing time in an attempt to planarize the surface of such layer. Such additional polishing may lead to the formation of additional particle defects, which may reduce device yields.

One particular problem arising in connection with the manufacturing of HK/MG gates is that, when the gate structure passes over or near an STI structure, and gate encapsulation is compromised, the high-k insulating material and/or the metal in the gate electrode, e.g., titanium nitride, can also be attacked by many common cleaning chemicals employed in semiconductor manufacturing operations. For example, the high-k insulating materials and/or the metal portions of the gate electrode may be attacked by hydrogen peroxide that is present to at least some degree in cleaning agents such as ammonium hydroxide, sulphuric acid, hydrochloric acid, etc.

FIGS. 1A-1D are schematic drawings that will be referenced to further explain at least one common form of attack of high-k, metal gate structures. FIG. 1A is an illustrative example of a device 10 having an STI structure 14 formed in a semiconducting substrate 12 that has an upper surface 12S. Typically, after the pad oxide layer and pad nitride layer that are used in forming the STI structure 14 are removed, the upper surface 14S of the STI structure 14 (as initially formed) will be above the level of the surface 12S of the substrate 12. FIG. 1B depicts the STI structure 14 at a later point in fabrication wherein the STI structure 14 has been eroded by various cleaning operations which result in the formation of schematically depicted divots or notches 14D in the STI structure 14. The overall height of the STI structure is also typically reduced to some degree due to the consumption of the STI material during the various cleaning operations. FIG. 1C depicts an illustrative high-k, metal gate structure 16 that is formed above the STI structure 14. The gate structure 16 is comprised of a high-k insulating layer 16A (e.g., hafnium oxide), a metal layer 16B (e.g., titanium nitride) and a layer of polysilicon 16C. Also depicted in FIG. 1C are illustrative sidewall spacers 18 that are intended to be part of the encapsulation materials that protect the gate structure 16 from attack after it is formed. One problem that may arise when the gate structure 16 passes over or near an STI region is that there may be a breakdown in the encapsulation protection of the gate structure 16, as indicated in the region 20. When such encapsulation protection breaks down, the high-k insulation layer 16A and/or the metal layer 16B are subject to chemical attack which may create voids 22 under the polysilicon layer 16C.

FIG. 1D is a plan view of one illustrative example where the problems described above with respect to FIGS. 1A-1C may occur. FIG. 1D depicts a plurality of active regions 24A, 24B that are defined by an STI region 14. In the depicted embodiment, the illustrative gate structure 16 passes over the active region 24B and extends for a length 16E over the STI region 14. In some applications, the distance 16E may be on the order of 200-1000 nm. The portion of the gate structure 16 that is positioned over the active region 24B acts as a gate electrode structure for a transistor to be formed in and above the active region 24B. The gate structure 16 is provided with the extended length 16E to assist in patterning other gate structures (not shown). That is, better patterning definition is achieved when many closely spaced parallel lines are patterned instead of isolated lines.

In one example, it has been observed that the chemical attack of the high-k insulation layer 16A and/or the metal layer 16B occurs in the region 28 where the gate structure 16 passes near the active region 24A. In one example, the distance 26 between the edge of the active region 24A and the edge of the gate structure 16 may be less than 15 nm. After the chemical attack occurs in the region 28, it tends to propagate along the long axis of the gate structure 16 to the point where it may attack the portion of gate structure 16 that is positioned above the active region 24B and thereby degrade, if not destroy, the performance capabilities of the transistor device formed therein.

FIG. 2 depicts one illustrative example of a prior art test structure 30 for investigating attacks on high-k metal gate structures. The test structure 30 is generally comprised of a serpentine shaped body or line 34 that passes over or near various active regions 32 formed in a semiconducting substrate. The active regions 32 are bounded by STI regions 14. Conductive contacts 35 are formed on opposite ends of the line 34. The line 34 was generally comprised of a high-k gate insulation layer, a metal layer positioned above the gate insulation layer and a layer of non-silicided polysilicon positioned above the metal layer. Using this test structure 30, chemical attack of the high-k material or the metal layer of the line 34 could be determined by measuring the change in resistance level of the test structure, wherein an increase in the resistance level reflected a loss of some of the metal layer The present disclosure is directed to various electrical test structures for evaluating semiconductor devices that employ high-k dielectrics and/or metal gate electrode structures that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various electrical test structures for evaluating semiconductor devices that employ high-k dielectrics and/or metal gate electrode structures. In one exemplary embodiment, a test structure is disclosed that includes an active region formed in a semiconducting substrate, a first line formed above and extending over an upper surface of the active region, and a first isolation region formed in the semiconducting substrate, the active region surrounding the first isolation region. The test structure further includes, among other things, a first extension formed above the active region and on and in contact with an upper surface of the first isolation region, wherein the first extension extends laterally over the upper surface of the active region from a first side of the first line. Additionally, the first line and the first extension are comprised of at least one of a high-k layer of insulating material and a metal layer.

In another disclosed embodiment, an exemplary test structure includes an active region formed in a semiconducting substrate and a first line formed above and extending over an upper surface of the active region. The disclosure test structure further includes, among other things, first and a second isolation regions formed in the semiconducting substrate and surrounded by the active region, wherein the first and second isolation regions are positioned proximate a first side of the first line. Additionally, a first extension is formed above the active region and on and in contact with an upper surface of the first isolation region, wherein the first extension extends laterally over the upper surface of the active region from the first side of said first line. Furthermore, the test structure includes third and fourth isolation regions formed in the semiconducting substrate and surrounded by the active region, wherein the third and fourth isolation regions are positioned proximate a second side of the first line, the second side of the first line being opposite of the first side of the first line. Finally, a second extension is formed above the active region and on and in contact with an upper surface of the third isolation region, wherein the second extension extends laterally over the upper surface of the active region from the second side of the first line, and the first line and the first and second extensions are comprised of at least one of a high-k layer of insulating material and a metal layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art structure wherein a high-k insulating material and or a metal gate structure have been subjected to chemical attack;

FIG. 2 depicts an illustrative embodiment of a prior art test structure that may be employed in an attempt to investigate the existence of and/or extent of the chemical attack depicted in FIGS. 1A-1D;

Figure 3:
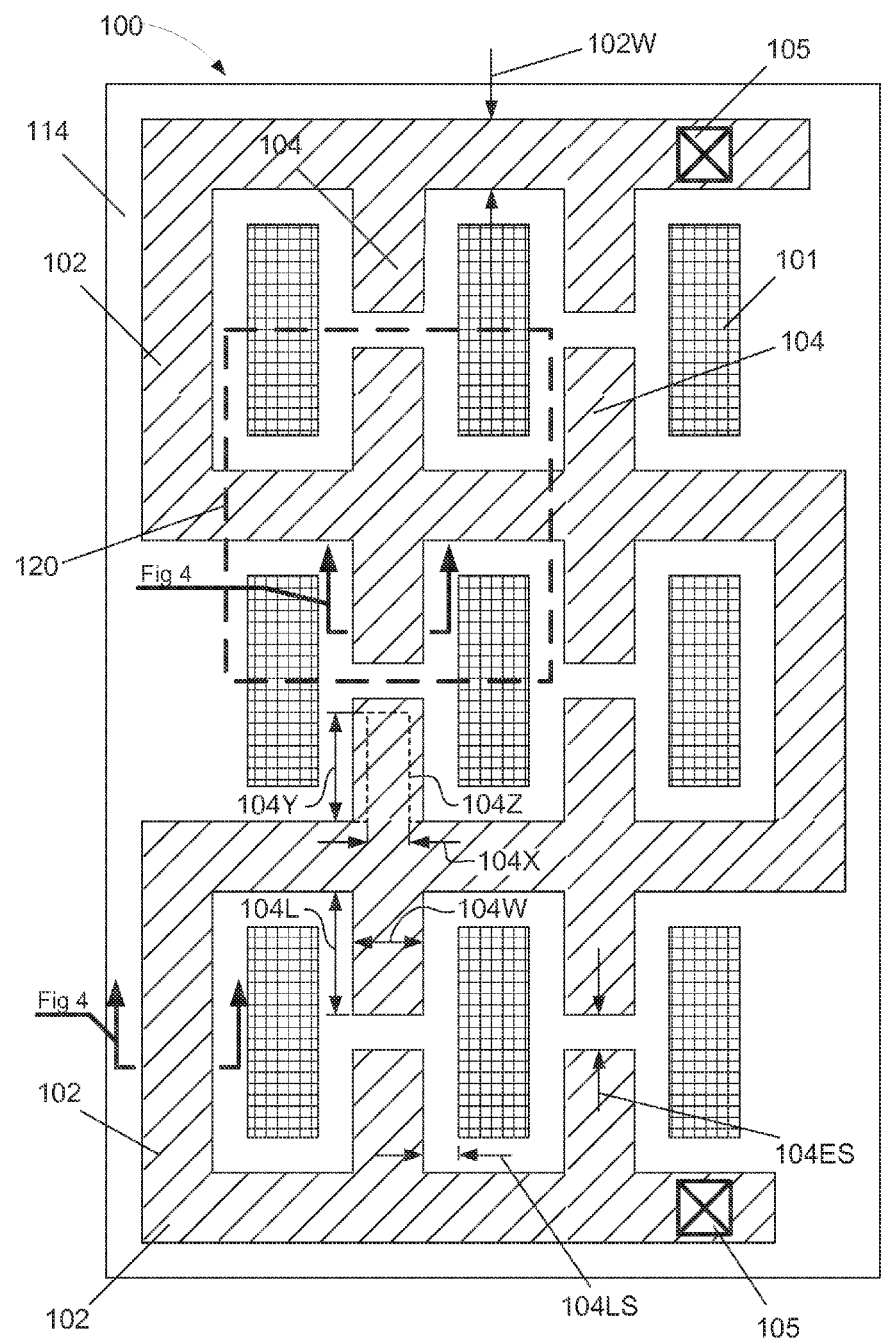
FIG. 3 is a plan view of one illustrative embodiment of a novel test structure disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various electrical test structures for evaluating semiconductor devices that employ high-k dielectrics and/or metal gate electrode structures. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASICs, logic devices, memory devices, etc. With reference to the attached drawings, various illustrative embodiments of the methods and devices disclosed herein will now be described in more detail.

FIG. 3 is a plan view of one illustrative embodiment of a novel test structure 100 disclosed herein. The test structure 100 is generally comprised of a body 102 and a plurality of extensions 104 arranged in an illustrative serpentine configuration. However, as will be recognized by those skilled in the art after a complete reading of the present application, the test structure 100 disclosed herein is not limited to such a serpentine configuration, as it could readily take other forms, such as one or more linearly configured test structures. A plurality of illustrative conductive contacts 105 are conductively coupled to the test structure 100. A plurality of active regions 101 are formed in a semiconducting substrate (not shown) wherein an isolation region 114 is formed. In one illustrative embodiment, the isolation structure 114 may have the configuration of an STI structure and it may be filled with an insulating material, such as silicon dioxide. In one particular embodiment disclosed herein, the test structure 100 is positioned above the isolation region 114 and the extensions 104 extend between or are positioned adjacent to one or more of the active regions 101. In general, and as discussed more fully below, the test structure 100 is generally comprised of a plurality of repetitive cells 120. As will be recognized by those skilled in the art after a complete reading of the present application, the size and plot space occupied by the test structure 100 may vary depending upon the particular application and the number of cells 120 in the test structure 100. In one illustrative embodiment, the test structure 100 may have a footprint of about 10,000 $\mu m^2$ (100 $\mu m \times 100$ $\mu m$).

The physical dimensions of various portions of the test structure 100 may vary depending upon the particular application. In one illustrative embodiment, the body may have a width (critical dimension) 102W that may range from about 14-130 nm. The extensions 104 may extend from the edge of the body 102 by a distance 104L that ranges from about 100-1000 nm and the extensions 104 may have a width 104W that may range from about 14-45 nm. The width 102W of the body 102 and the width 104W of the extensions need not be the same, although they may be in some applications. In some embodiments, the width 102W of the body 102 may be greater than the width 104W of the extensions 104. Furthermore, in some embodiments, the width 104W may be different for one or more of the extensions 104, such as a width 104X for an extension 104Z, as indicated in dashed lines FIG. 3. The ends of the opposing extensions 104 are spaced apart from one another by a distance 104ES which may vary depending on the particular application. In one illustrative embodiment, the distance 104ES may be about 25-100 nm. Additionally, the lateral offset spacing 104LS of the extensions 104 from the edge of the nearest active region 101 may vary depending upon the particular application. In one illustrative embodiment, the distance 104LS may be about 0-15 nm. It should also be noted that the magnitude of the distance 104L by which the extensions 104 extend away from the edge of the body 102 need not be uniform throughout the test structure 100, although it may be in some cases. For example, in some applications, the distance 104L may be different for at least one or perhaps several of the extensions 104, such as a distance 104Y for the extension 104Z, as shown in FIG. 3.

Figure 4:
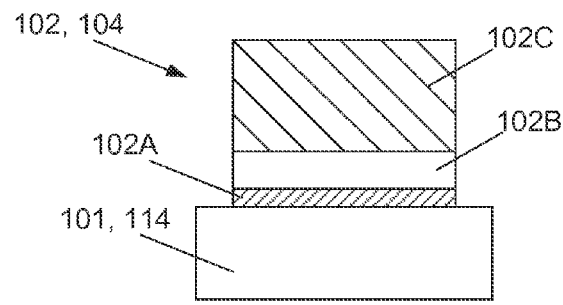
FIG. 4 is a cross-sectional view of one illustrative embodiment of a novel test structure disclosed herein.

FIG. 4 is a cross-sectional view of one illustrative embodiment of the body 102 and the extensions 104, although the width of the body 102 and the extensions 104 may be different. As shown therein, the body 102/extensions 104 are comprised of a high-k gate insulation layer 102A, a metal layer 102B and a layer 102C that are formed above the isolation structure 114. In some illustrative embodiments, the body 102/extensions 104 may be formed directly on and in contact with the isolation region 114 (see, FIGS. 3 and 8), as is depicted in FIG. 4. In other embodiments, the body 102/extensions 104 may also be formed directly on and in contact with the active region 101, as will be further discussed with respect to FIG. 8 below. Typically, the encapsulating sidewall spacers (not shown), e.g., silicon nitride, are formed on the sidewall of the structure depicted in FIG. 4. The structure depicted in FIG. 4 may be formed by depositing the corresponding layer of material and thereafter patterning those layers using known photolithography and etching techniques. It should be understood that the present invention is not limited to applications where the body 102/extensions 104 have the illustrative structure depicted in FIG. 4. That is, the inventions disclosed herein may also be employed in situations where the body 102/extensions 104 only employ one of the high-k insulation layer 102A or the metal layer 102, but not both. The body 102/extensions 104 may be manufactured at the same time corresponding gate electrode structures are fabricated for production devices. The body 102/extensions 104 may be formed using so-called "gate-first" or "gate-last" techniques.

The high-k gate insulation layer 102A may be comprised of a high-k material (k value greater than 10) such as, for example, hafnium oxide, zirconium oxide, hafnium silicate, zirconium silicate, titanium oxide, etc., and its thickness may vary depending upon the particular application, e.g., 2-5 nm. The metal layer 102 may be comprised of a variety of metals or metal alloys and its thickness may vary depending upon the particular application. For example, the metal layer 102B may be comprised of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like. In one illustrative embodiment, the metal layer 102B may be a layer of titanium nitride having a thickness of about 2-5 nm. Additionally, in some embodiments, the body 102/extensions 104 may have multiple metal layers. The layer 102C may be comprised of a material that is less electrically conductive than the metal layer 102B. For example, the layer 102C may be a layer of a silicon-containing material, such as polysilicon or amorphous silicon, having a thickness of about 40-80 nm. In one particular embodiment, the layer 102C may be a layer of silicon-containing material, such as polysilicon or amorphous silicon, that does not have a metal silicide formed thereon, i.e., a non-silicided silicon-containing material.

Figure 5:
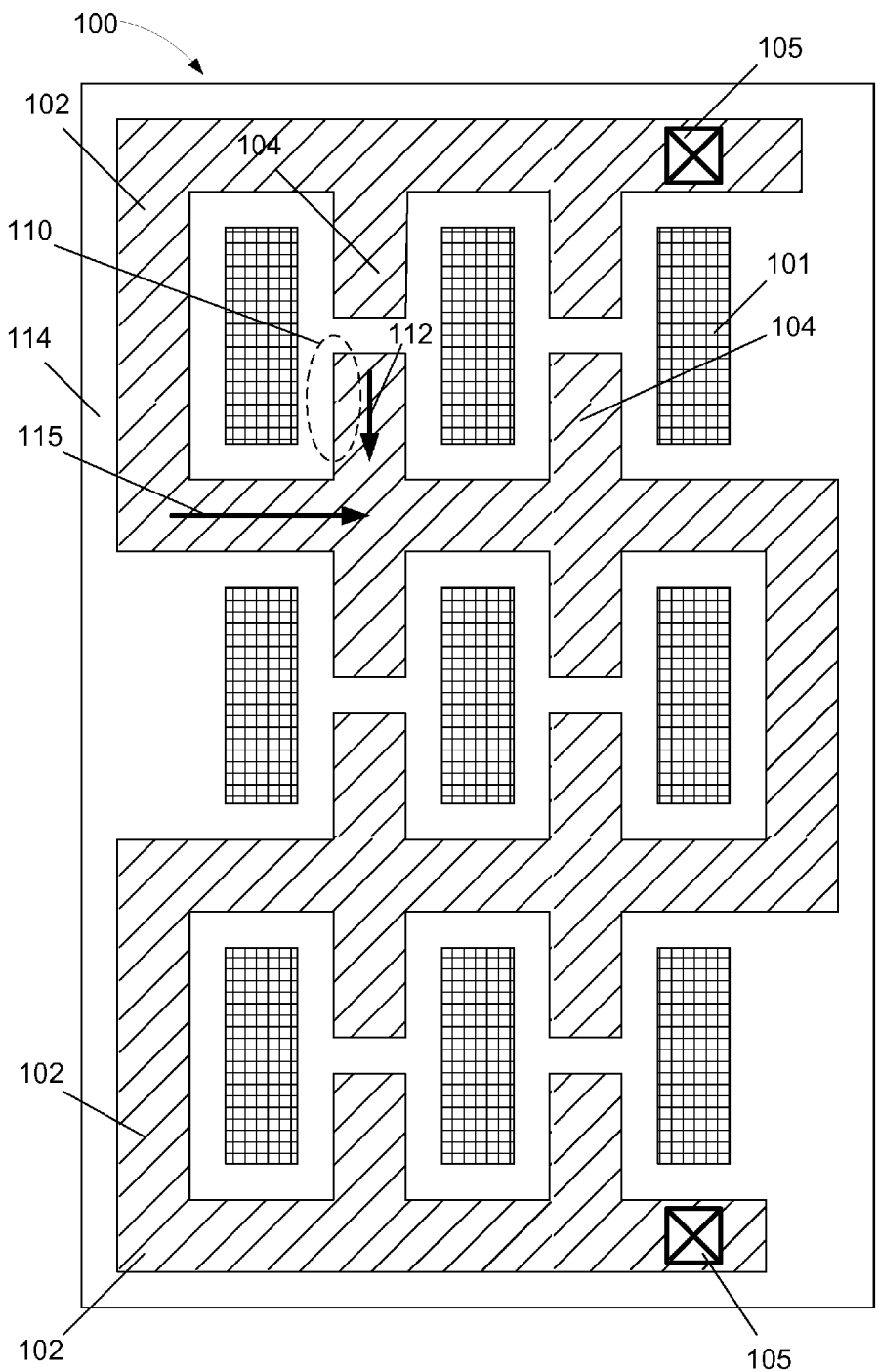
FIG. 5 is a plan view of the illustrative embodiment of the test structure depicted in FIG. 3, wherein the use of test structure is discussed.

As shown in FIG. 5, when encapsulation of a portion of the body 102 and/or a portion of the extensions 104 fails, chemicals used in various cleaning operations may attack the high-k insulating layer 102A and/or the metal layer 102B. For example, if encapsulation of the extension 104 fails in the region 110, the high-k insulating layer 102A and/or the metal layer 102B may be initially attacked in the region 110. Over time, the attack on the high-k insulating layer 102A and/or the metal layer 102B will propagate down the extension 104 in the direction indicated by the arrow 112.

The various embodiments of the presently disclosed test structure 100 may be used to evaluate whether or not such attacks have occurred. More specifically, since the body 102 and the extensions 104 are comprised of materials such that the metal layer 102B (see, FIG. 4) is the most conductive layer of the body 102 or the extensions 104, the metal layer 102B will be the primary carrier of electrical current, as reflected by the arrow 115. The resistance of a control test structure 100 that is unaffected by the aforementioned chemical attacks, or the test structure under observation immediately after it is patterned, may be determined by appropriate testing, i.e., by applying a voltage to the test structure 100 via the contacts 105, measuring the current 115 flowing as a result of the applied voltage and calculating the resistance of the control test structure 100 from those two values. To determine if any chemical attack has occurred on the high-k insulating layer 102A and/or the metal layer 102B, the resistance of the subject test structure 100 may be determined after it is has been subjected to any number of processing operations, e.g., cleaning operations. If the metal layer 102B has been attacked and propagated to any appreciable degree, the resistance of the subject test structure 100 should increase relative to the resistance of the control test structure or the test structure as originally patterned. The resistance of the subject test structure 100 may be determined as described previously for the control test structure 100. Thus, an increase in the resistance of the subject test structure 100 is indicative that encapsulation has failed at some location on the subject test structure 100. The magnitude of the change in resistance, coupled with knowledge of the processing operations performed on the subject test structure 100, may give some indication as to the scope or extent of the chemical attack. If desired, this change in the electrical characteristics may also be correlated with other processing parameters, such as yield loss. Of course, variations of other electrical properties of the subject test structure may also be indicative of the loss of encapsulation and the chemical attack of the high-k insulating layer 102A and/or the metal layer 102B. For example, if the same voltage is applied to the subject test structure immediately after it is patterned and after it has been subjected to one or more cleaning operations, then a change in the current 115 that passes through the subject test structure 100 is also indicative that the high-k insulating layer 102A and/or the metal layer 102B has been attacked. That is, for the same applied voltage, if the current 115 increases, that is a reflection that there has been a loss of some of the metal layer 102B due to chemical attack. However, since the materials of most metal layers 102B used in device fabrication have a similar etch rate to most high-k insulating materials used in device fabrication (typically within a factor of 2 of each other), the detected loss of metal using the test structure 100 serves as a relatively good proxy for the loss of high-k material as well. The loss of either the high-k material or metal gate materials from an active transistor is sufficient to degrade the performances of the transistor and, in some cases, may cause the transistor to cease functioning.

Figure 6:
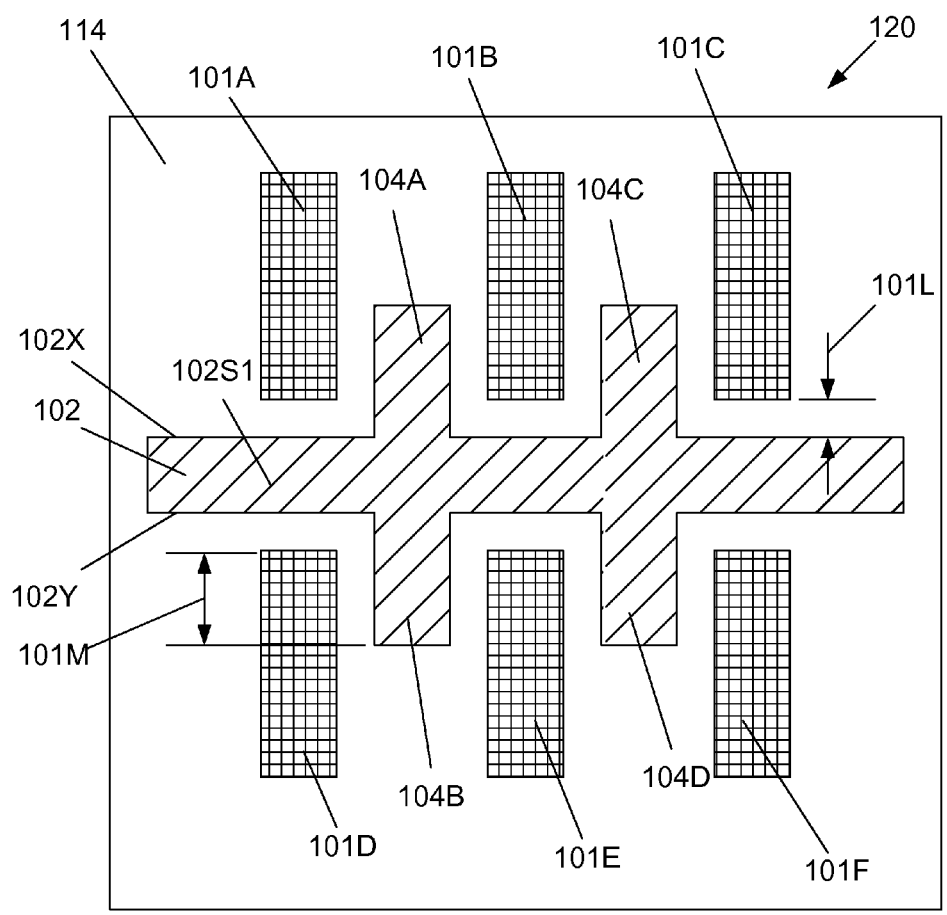
FIG. 6 is a plan view of one illustrative embodiment of a unit cell of the illustrative test structure disclosed herein.

As shown in FIG. 3, the test structure 100 is generally comprised of a plurality of repetitive cells 120. Of course, the illustrative repetitive cell 120 depicted in FIG. 3 is only one of many possible "repetitive cells" that might be found in the test structure 100 given the repetitive nature of the illustrative configuration depicted in FIG. 3. FIG. 6 is an enlarged view of one illustrative embodiment of such a cell 120. As shown therein, the body 102 is generally comprised of a side line 102S1 and a plurality of extensions 104A-D that extend away from a first side 102X of the side line 102S1 into the recess 122 toward the second side line 102S2. A plurality of extensions 104B, 104D extend away from a second side 102Y of the side line 102S1. Also depicted in FIG. 6 are a plurality of active regions 101A-F. The active regions 101A-C are formed in the substrate proximate the first side 102X of the side line 102S1, while the active regions 101D-F are formed in the substrate proximate the second side 102Y of the side line 102S1. In the depicted example, the extensions 104A-D are positioned between two adjacent active regions, e.g., extension 104A is positioned between the active regions 101A-B, while the extension 104D is positioned between the active regions 101E-F; however, such an illustrative configuration is not required in all applications. The number of extensions 104 extending from the side line 102S1 may vary depending upon the particular application, i.e., the number of extensions 104 extending from the side line may range from one to any desired number consistent with plot space limitations for the test structure 100 and various design rules. For example, in some embodiments, the illustrative unit cell depicted in FIG. 6 may only have one extension, e.g., extension 104A (i.e., 104C-D may be deleted). Moreover it is not required that an extension, e.g., 104A, be positioned between two active regions to practice aspects of the present invention. For example, in one embodiment of the cell 120, the extensions 104B-D and the active regions 101B-F could be deleted such that the lone remaining extension 104A is positioned proximate to the lone active region 101A. It is also not required that the extensions 104A and 104B be positioned directly opposite one another on opposite sides of the side line 102S1 as depicted in FIG. 6.

With further reference to FIG. 6, variations in the distance 101L between the end of the active regions and a corresponding side line 102S1 can assist in characterizing the amount and extent of the attack or etching of the high-k insulating layer 102A and/or the metal layer 102B. As the distance 101L is increased, the etch front that causes the high-k/metal gate loss must propagate an increased distance down the length of the extensions 104A-D to reach the body side line 102S1. By placing multiple extensions 104, each with a different distance 101L, on the same wafer, the amount of chemical attack that takes place following an encapsulation breach can be quantified, i.e., at some point the distance 101L will be too great for the etch front to make it all the way to the side line 102S1 of the body 102, so the metal layer 102B won't be removed from the current conduction path. In one illustrative embodiment, the distance 101L may be about 30-300 nm. Variations in the amount of overlap 101M between the active regions and a corresponding extension 104A-D can assist in characterizing the amount and extent of the encapsulation breach. The probability of an encapsulation breach on any given extension 104 increases proportionally as the distance 101M is increased. Thus, with the extensions 104A-D each positioned with a different distance 101M on the same wafer, the probability of encapsulation breach can be evaluated semi-quantitatively. In one illustrative embodiment, the distance 101M may be about 30-300 nm.

Figure 7A:
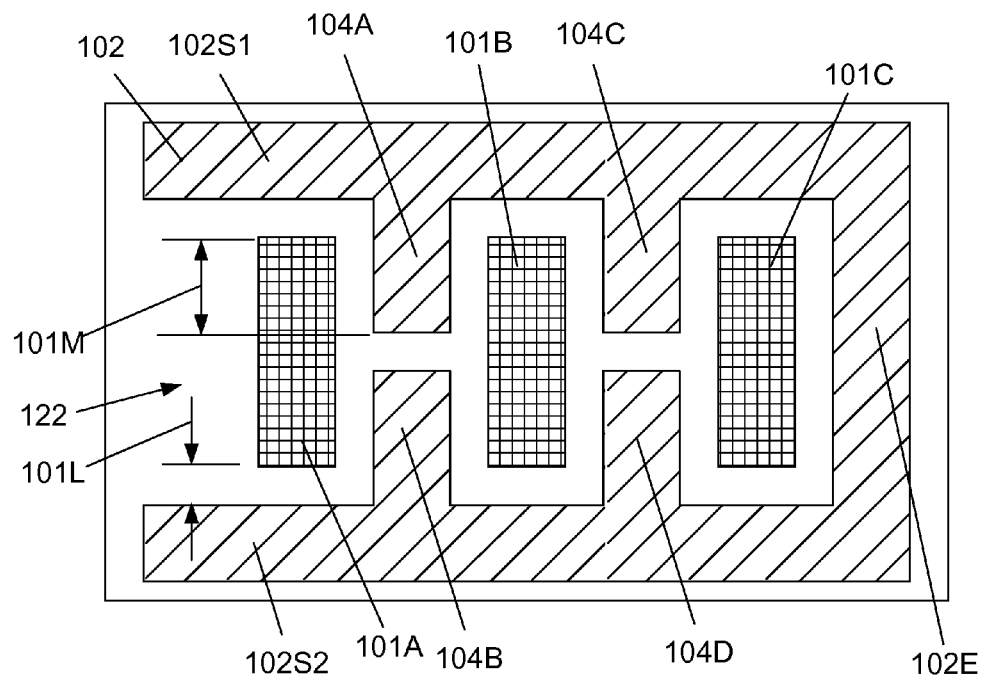
FIG. 7A is an enlarged plan view of a portion of the illustrative embodiment of the test structure depicted in FIG. 3.
Figure 7B:
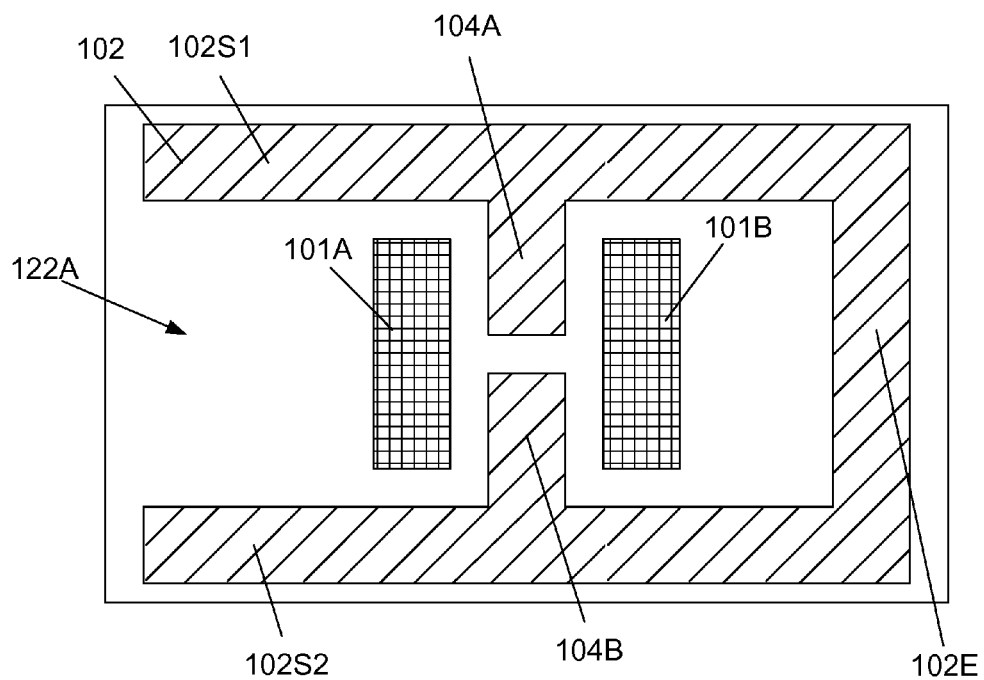
FIG. 7B is an enlarged plan view of a portion of an alternative embodiment of the test structure disclosed herein.

FIG. 7A is an enlarged view of a portion of the test structure 100. As shown therein, the body 102 is generally comprised of the first side line 102S1, a second side line 102S2 and an end line 102E that is connected to the first and second side lines 102S1, 102S2. The first side line 102S1 and second side line 102S2 at least partially define a recess 122. In further embodiments, the first side line 102S1, the second side line 102S2 and the end line 102E further partially define the recess 122. A plurality of extensions 104A, 104C extend from the first side line 102S1 into the recess 122 toward the second side line 102S2. A plurality of extensions 104B, 104D extend from the second side line 102S2 into the recess 122 toward the first side line 102S2. The number of extensions 104 on the sides 102S1, 102S2 may vary depending upon the particular application, i.e., the number of extensions 104 extending from a particular side line may range from zero to any desired number consistent with plot space limitations for the test structure 100 and various design rules. Also depicted in FIG. 7A are a plurality of active regions 101A, 101B and 101C. In the depicted example, the extensions 104A-D are positioned between two adjacent active regions, e.g., extensions 104A-B are positioned between active regions 101A-B, although such a configuration is not required in all applications. For example, FIG. 7B depicts an alternative arrangement of a portion of the test structure 100 wherein only two extensions 104A-B and two active regions 101A-B are employed. In other embodiments, only one of the extensions, e.g., 104A may be employed, and the extension 104B shown in FIG. 7B may be omitted. In some applications, one of the active regions 101A or 101B in FIG. 7B could be eliminated such that the extensions 104A-B are positioned proximate only a single active region 101A.

With further reference to FIG. 7A, similar to the earlier discussion regarding FIG. 6, variations in the distance 101L between the end of the active regions and a corresponding side line 102S1, 102S2 can assist in characterizing the amount and extent of the attack or etching of the high-k insulating layer 102A and/or the metal layer 102B. As the distance 101L is increased, the etch front that causes the high-k/metal gate loss must propagate an increased distance down the length of the extensions 104A-D to reach the body side lines 102S1, 102S2. By placing multiple extensions 104, each with a different distance 101L, on the same wafer, the amount of chemical attack that takes place following an encapsulation breach can be quantified, i.e., at some point, the distance 101L will be too great for the etch front to make it all the way to the side lines 102S1, 102S2 of the body 102, so the metal layer 102B won't be removed from the current conduction path. In one illustrative embodiment, the distance 101L may be about 30-300 nm. Variations in the amount of overlap 101M between the active regions and a corresponding extension 104A-D can assist in characterizing the amount and extent of the encapsulation breach. The probability of an encapsulation breach on any given extension 104 increases proportionally as the distance 101M is increased. Thus, by placing multiple side lines 102S1, 102S2, with an identical number of extensions 104A-D (each positioned with a different distance 101M) on the same wafer, the probability of encapsulation breach can be evaluated semi-quantitatively. In one illustrative embodiment, the distance 101M may be about 30-300 nm.

Figure 8:
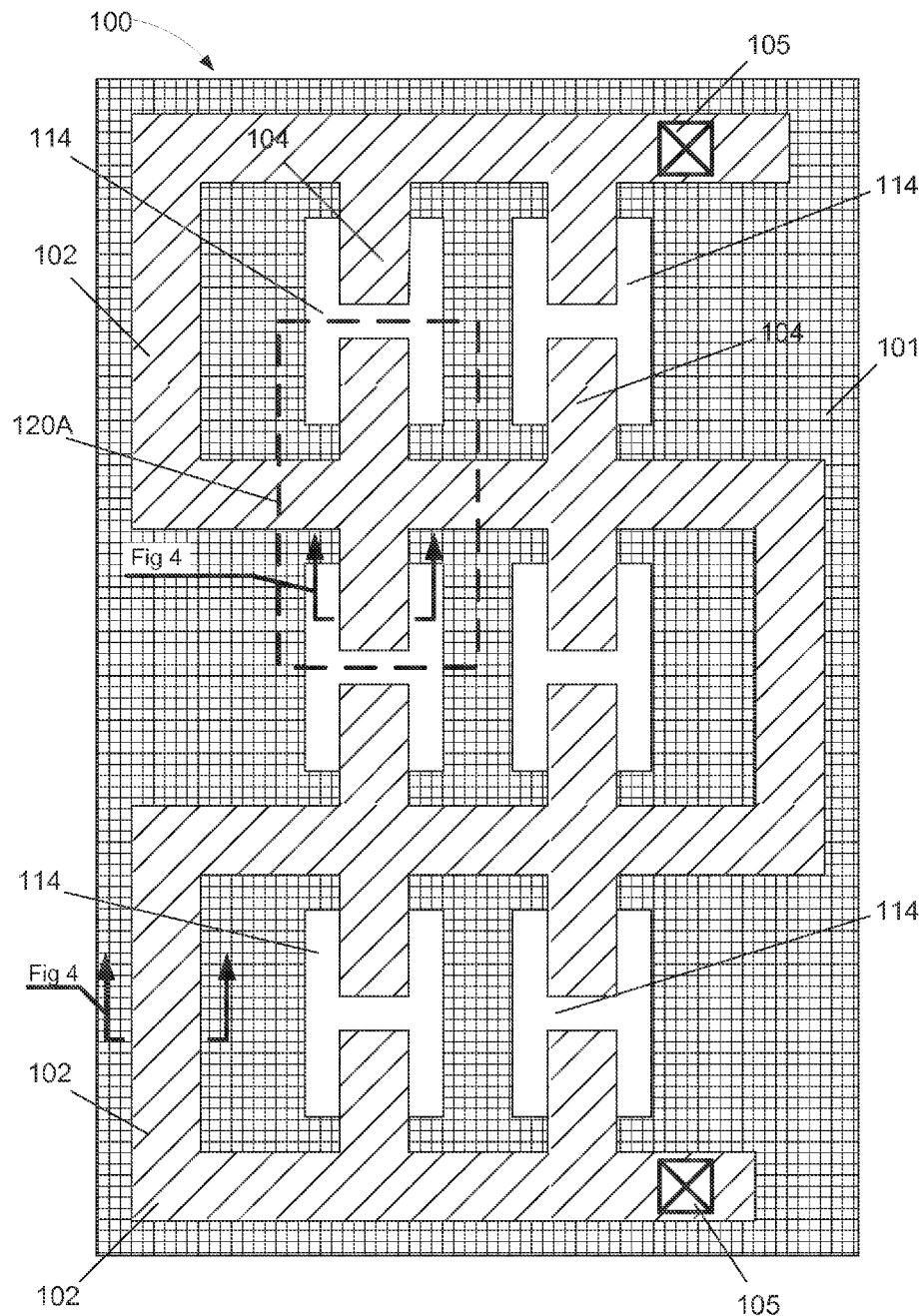
FIG. 8 is a plan view of another illustrative embodiment of a novel test structure disclosed herein.

FIG. 8 depicts an alternative embodiment of the test structure 100 disclosed herein. In this embodiment, islands of isolation regions 114 are formed in a larger active region 101. The body 102 of the test structure 100 is formed above the active region 101, while the extensions 104 are formed on both the active region 101 and one of the isolation regions 114. This embodiment of the test structure 100 has a different repetitive cell configuration 120A by virtue of the change in the active region 101, the isolation regions 114 and the placement of the extensions 104 on the isolation regions 114.

Figure 9:
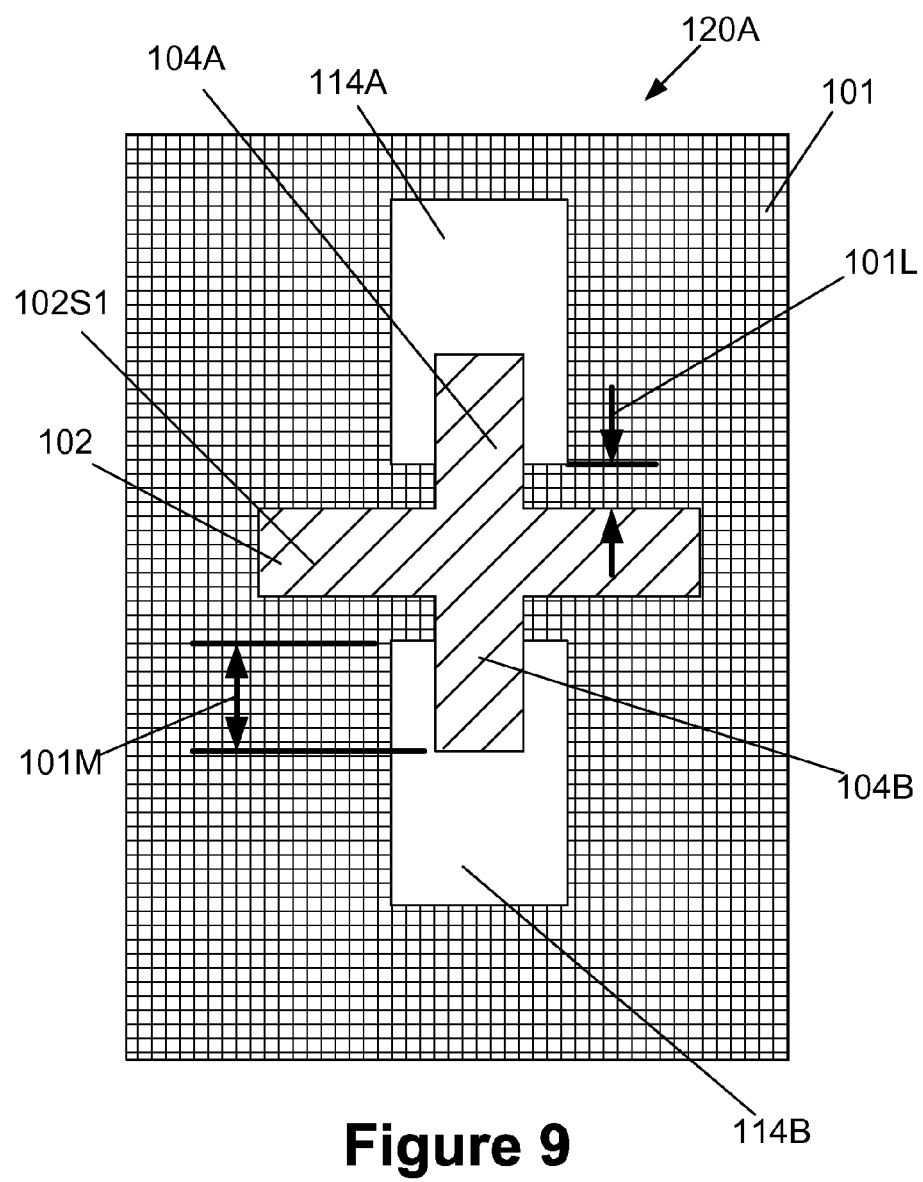
FIG. 9 is a plan view of one illustrative embodiment of a unit cell of an alternative illustrative test structure disclosed herein.

FIG. 9 is an enlarged view of one illustrative embodiment of such a cell 120A. As shown therein, the body 102 is still generally comprised of the first side line 102S1. In this embodiment, the illustrative extension 104A extends onto that isolation region 114A, while the extension 104B extends onto the isolation region 114B. As noted earlier, in some applications, one of the extensions and one of the isolation regions in this embodiment of the unit cell 120A may be omitted. In this embodiment of the test structure 100, an attack on the high-k insulating layer 102A and/or the metal layer 102B may be determined by measuring or determining a change in an electrical characteristic of the test structure 100, such as capacitance.

Figure 10:
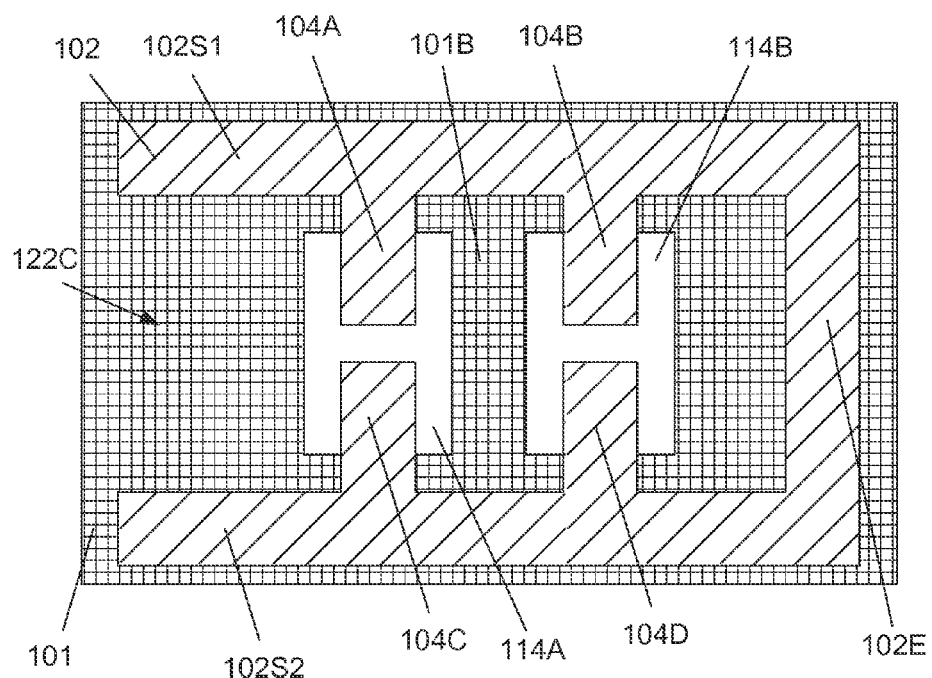
FIG. 10 is a plan view of a portion of the illustrative embodiment of the test structure depicted in FIG. 8.

FIG. 10 is an enlarged view of a portion of the alternative test structure depicted in FIG. 8. As shown therein, the body 102 is still generally comprised of a first side line 102S1, a second side line 102S2 and an end line 102E that is connected to the first and second side lines 102S1, 102S2. In this embodiment, the first side line 102S1, second side line 102S2 and end line 102E generally define a recess 122C. In this embodiment, attack of the high-k insulating layer 102A and/or the metal layer 102B may be determined by measuring or determining a change in an electrical characteristic of the test structure 100, such as capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A test structure, comprising:
   an active region formed in a semiconducting substrate;
   a first line formed above and extending over an upper surface of said active region;
   a first isolation region formed in said semiconducting substrate, said active region surrounding said first isolation region;
   a first extension formed above said active region and on and in contact with an upper surface of said first isolation region, said first extension extending laterally over said upper surface of said active region from a first side of said first line, wherein said first line and said first extension are comprised of at least one of a high-k layer of insulating material and a metal layer;
   a second isolation region formed in said semiconducting substrate, said active region surrounding said second isolation region, wherein at least a portion of said first line extends laterally adjacent to said first and second isolation regions; and
   a second extension formed above said active region and on and in contact with an upper surface of said second isolation region, said second extension extending laterally over said upper surface of said active region from one of said first side of said first line and a second side of said first line that is opposite of said first side of said first line, wherein said second extension is comprised of at least one of said high-k layer of insulating material and said metal layer.

2. The test structure of claim 1, wherein said first line has a first width and said first extension has a second width, wherein said second width is less than said first width.

3. The test structure of claim 1, wherein said first extension and said second extension extend a same distance laterally away from said first line.

4. The test structure of claim 1, wherein said first extension and said second extension extend different distances laterally away from said first line.

5. The test structure of claim 1, wherein said first extension and said second extension have different widths.

6. The test structure of claim 1, wherein said first line and said first extension comprise said high-k layer of insulating material, said metal layer positioned above said high-k layer of insulating material, and a layer of material positioned above said metal layer, wherein an electrical conductivity of said layer of material is less than an electrical conductivity of said metal layer.

7. The test structure of claim 6, wherein said layer of material is a non-silicided silicon-containing material.

8. The test structure of claim 7, wherein said non-silicided silicon-containing material is one of a non-silicided polysilicon and a non-silicided amorphous silicon.

9. The test structure of claim 1, wherein first line and said first extension are formed on and in contact with said upper surface of said active region.

10. A test structure, comprising:
    an active region formed in a semiconducting substrate;
    a first line formed above and extending over an upper surface of said active region;
    first and a second isolation regions formed in said semiconducting substrate and surrounded by said active region, wherein said first and second isolation regions are positioned proximate a first side of said first line;
    a first extension formed above said active region and on and in contact with an upper surface of said first isolation region, said first extension extending laterally over said upper surface of said active region from said first side of said first line;
    third and fourth isolation regions formed in said semiconducting substrate and surrounded by said active region, wherein said third and fourth isolation regions are positioned proximate a second side of said first line, said second side of said first line being opposite of said first side of said first line; and
    a second extension formed above said active region and on and in contact with an upper surface of said third isolation region, said second extension extending laterally over said upper surface of said active region from said second side of said first line, wherein said first line and said first and second extensions are comprised of at least one of a high-k layer of insulating material and a metal layer.

11. The test structure of claim 10, wherein first line and said first extension are formed on and in contact with said upper surface of said active region.

12. The test structure of claim 10, wherein said first line has a first width and said first extension and said second extension have a second common width, wherein said second common width is less than said first width.

13. The test structure of claim 10, wherein said first extension and said second extension extend a same distance laterally away from said first line.

14. The test structure of claim 10, wherein said first extension and said second extension extend different distances laterally away from said first line.

15. The test structure of claim 10, wherein said first extension and said second extension have different widths.

16. The test structure of claim 10, further comprising:
    a third extension formed above said active region and on and in contact with an upper surface of said second isolation region, said third extension extending laterally over said upper surface of said active region from said first side of said first line; and
    a fourth extension formed above said active region and on and in contact with an upper surface of said fourth isolation region, said fourth extension extending laterally over said upper surface of said active region from said second side of said first line, wherein said third and fourth extensions are comprised of at least one of said high-k layer of insulating material and said metal layer.

17. The test structure of claim 10, wherein said first line and said first and second comprise said high-k layer of insulating material, said metal layer positioned above said high-k layer of insulating material, and a layer of material positioned above said metal layer, wherein an electrical conductivity of said layer of material is less than an electrical conductivity of said metal layer.

18. The test structure of claim 17, wherein said layer of material is a non-silicided silicon-containing material.

* * * * *